(12) United States Patent
Hsu et al.

(10) Patent No.: US 11,805,660 B2
(45) Date of Patent: *Oct. 31, 2023

(54) SEMICONDUCTOR STRUCTURE

(71) Applicant: TAIWAN SEMICONDUCTOR MANUFACTURING COMPANY LTD., Hsinchu (TW)

(72) Inventors: Chern-Yow Hsu, Hsin-Chu County (TW); Yuan-Tai Tseng, Hsinchu County (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/699,180

(22) Filed: Mar. 21, 2022

(65) Prior Publication Data

US 2022/0216267 A1 Jul. 7, 2022

Related U.S. Application Data

(60) Continuation of application No. 17/336,024, filed on Jun. 1, 2021, now Pat. No. 11,569,296, which is a division of application No. 16/998,866, filed on Aug. 20, 2020, now Pat. No. 11,037,983, which is a continuation of application No. 15/960,238, filed on Apr. 23, 2018, now Pat. No. 10,763,304.

(60) Provisional application No. 62/525,610, filed on Jun. 27, 2017.

(51) Int. Cl.
*H10B 61/00* (2023.01)
*H01L 23/522* (2006.01)
*H10N 50/01* (2023.01)
*H10N 50/80* (2023.01)

(52) U.S. Cl.
CPC ......... *H10B 61/22* (2023.02); *H01L 23/5226* (2013.01); *H10N 50/01* (2023.02); *H10N 50/80* (2023.02)

(58) Field of Classification Search
CPC .............................. H01L 27/226; H10B 61/22
See application file for complete search history.

(56) References Cited

U.S. PATENT DOCUMENTS

2009/0261433 A1* 10/2009 Kang ...................... H01L 43/02
257/E29.323
2017/0053965 A1* 2/2017 Baek ...................... H01L 43/08
2018/0374895 A1* 12/2018 Hsu ......................... H01L 43/12

* cited by examiner

*Primary Examiner* — Mounir S Amer
(74) *Attorney, Agent, or Firm* — WPAT LAW; Anthony King

(57) ABSTRACT

The present disclosure provides a semiconductor structure. The semiconductor structure includes a memory region, the memory region includes a first metal line, a magnetic tunneling junction (MTJ) over the first metal line, a cap, wherein at least a portion of the cap is above the MTJ, a first stop layer above the cap, and a first metal via being disposed over the MTJ and in direct contact with the first stop layer, and a logic region adjacent to the memory region, the logic region includes a second metal line, a third metal line over the second metal line, a second stop layer being disposed over the third metal line, and a second metal via over the third metal line.

20 Claims, 25 Drawing Sheets

SEMICONDUCTOR STRUCTURE

CROSS-REFERENCE TO RELATED APPLICATIONS

The present application is a continuation application of prior-filed U.S. non-provisional application Ser. No. 17/336,024, filed Jun. 1, 2021, which claims the benefit of prior-filed U.S. provisional application No. 62/525,610, filed Jun. 27, 2017, U.S. non-provisional application Ser. No. 15/960,238, filed Apr. 23, 2018, and U.S. non-provisional application Ser. No. 16/998,866, filed Aug. 20, 2020, under 35 U.S.C. 120.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
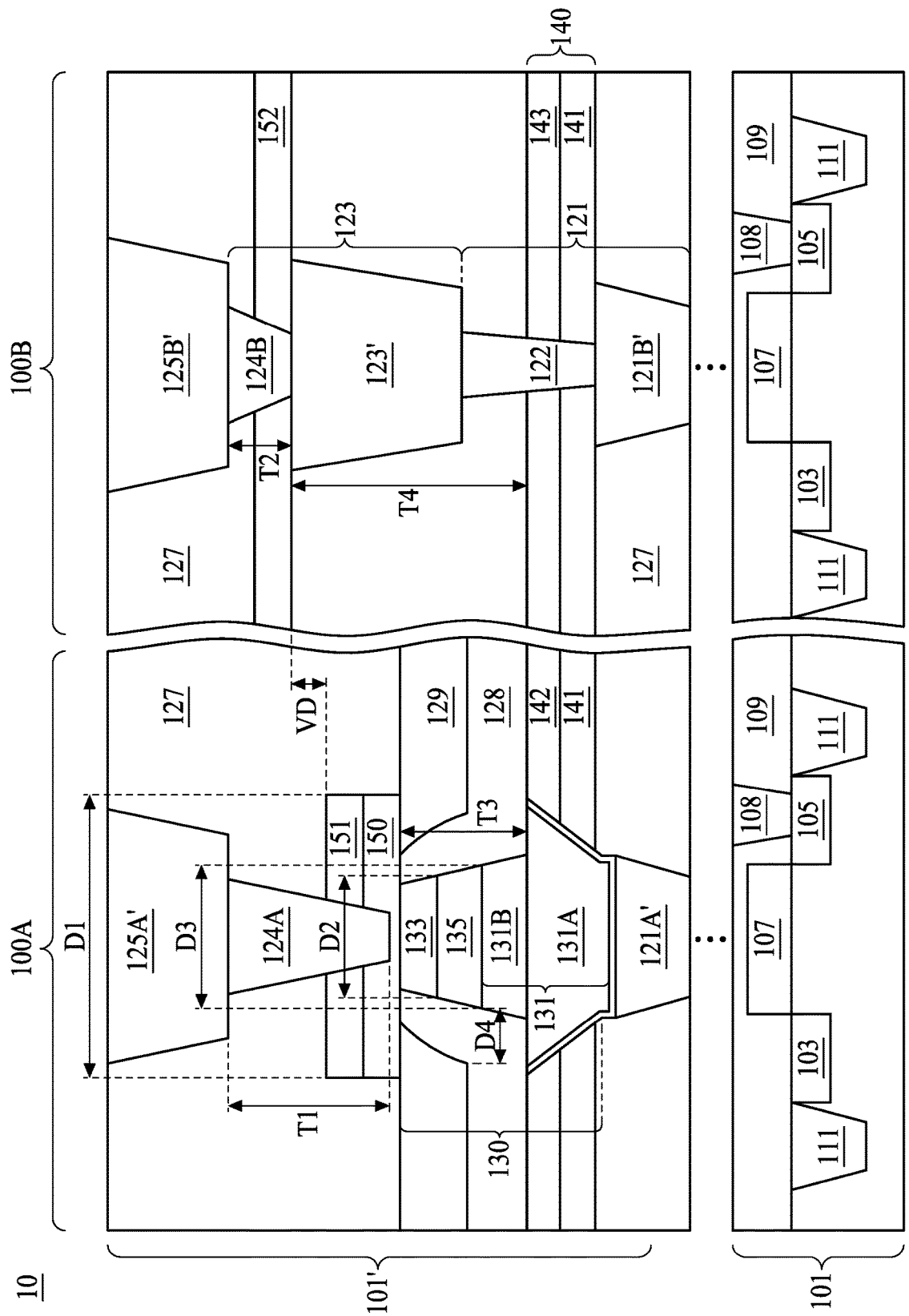
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. Conventionally, the MRAM cell can be embedded in any position of the metallization layer, for example, between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

As the CMOS technology node goes down, the thickness of the inter-metal dielectric (IMD) in the back-end-of-line (BEOL) continues to scale down and become significantly thin in technology node N16 and beyond. However, due to processing barrier, the thickness of the MTJ stack cannot be reduced accordingly. For example, an average thickness of the MTJ stack (including the upper electrode, the lower electrode, and the MTJ layer sandwiched there between) is referred to a first height h. On the other hand, the IMD thickness between two adjacent metal line layers is referred to a second height H. Thickness of the MTJ stack (i.e., h) is kept constant while the IMD thickness (i.e., H) becomes thinner along the scale down of the technology node. Therefore, the room for accommodating an upper metal over the upper electrode of the MTJ is reduced. The reduction of upper metal thickness leads to short circuit between the upper metal and the MTJ.

The present disclosure provides a semiconductor structure where a top electrode cap (hereinafter the "cap") and a first stop layer disposed over the top electrode of an MTJ in a memory region. The MTJ is disposed over a first $N^{th}$ metal line. The cap is formed over the top electrode in order to prevent the occurrence of short circuit between the upper metal to the MTJ. In addition, the cap is disposed between the first stop layer and the top electrode of the MTJ. Moreover, a first $(N+1)^{th}$ metal via is disposed over the MTJ and a bottom portion of which is surrounded by the first stop layer. The first $(N+1)^{th}$ metal via has a first height. Furthermore, a second stop layer disposed over an $(N+1)^{th}$ metal line in a logic region adjacent to the memory region. A second $(N+1)^{th}$ metal via is disposed over the $(N+1)^{th}$ metal line and has a second height. The first height is greater than the second height. In some embodiments, the memory region includes a MRAM cell, a RRAM cell, or a Flash cell.

Referring to FIG. 1, FIG. 1 is a cross section of a semiconductor structure 10, in accordance with some embodiments of the present disclosure. The semiconductor structure 10 can be a semiconductor circuit including a MRAM cell region 100A and a logic region 100B. Each of the MRAM cell region 100A and the logic region 100B has a transistor structure 101 in a semiconductor substrate 100. In some embodiments, the transistor structures 101 are substantially identical in the MRAM cell region 100A and in the logic region 100B. In some embodiments, the semiconductor substrate 100 may be but is not limited to, for example, a silicon substrate. In an embodiment, substrate 100 is a semiconductor substrate, such as a silicon substrate, although it may include other semiconductor materials, such as silicon germanium, silicon carbide, gallium arsenide, or the like. In the present embodiment, the semiconductor substrate 100 is a p-type semiconductor substrate (P-Substrate) or a n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combination thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 107. Contact plugs 108 are formed in inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 1 shows a planar transistor having a doped region in the semiconductor substrate 100. However, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STI 111 are formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

Referring to FIG. 1, a metallization structure 101' is disposed above the transistor structure 101. Because the $N^{th}$ metal line 121A' of the $N^{th}$ metal layer 121 may not be the first metal layer over the transistor structure 101, the omission of a portion of the metallization structure 101' is represented by dots. In the MRAM cell region 100A, an MTJ structure 130 is disposed between an $N^{th}$ metal line 121A' of the $N^{th}$ metal layer 121 and an $(N+1)^{th}$ metal via 124A of the $(N+1)^{th}$ metal layer 123, whereas in the logic region 100B, the $N^{th}$ metal line 121B' is connected to the $(N+1)^{th}$ metal via 124B by an $N^{th}$ metal via 122 of the $N^{th}$ metal layer 121 and an $(N+1)^{th}$ metal line 123' of the $(N+1)^{th}$ metal layer 123. In some embodiments, the metal lines and metal vias are filled with electrically conductive material, e.g. copper, gold or another suitable metal or alloy, to form a number of conductive vias. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers, namely $M_1, M_2 \ldots M_N$. Throughout the description, the term "metal layer" refers to the collection of the metal lines in the same layer. Metal layers $M_1$ through $M_N$ are formed in inter-metal dielectrics (IMDs) 127, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5. The $N^{th}$ metal via 122 and the $(N+1)^{th}$ metal line 123' may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Referring to the MRAM cell region 100A of the semiconductor structure 10, the MTJ structure 130 at least includes a bottom electrode 131, a top electrode 133, and an MTJ 135. In some embodiments, the bottom electrode 131 possesses a trapezoidal recess in a composite layer including SiC 141 and tetraethyl orthosilicate (TEOS) 142. Alternatively, the TEOS 142 can be replaced or combined with silicon-rich oxides (SRO). In some embodiments, the bottom electrode 131 may include metal nitrides. In some embodiments, the top electrode 133 may include metal nitrides. Materials constituting the bottom electrode 131 and the top electrode 133 may or may not be identical. In some embodiments, the bottom electrode may compose more than one material and form a material stack. In some embodiments, the bottom electrode includes TiN, TaN, W, Al, Ni, Co, Cu, or combinations thereof. As shown in FIG. 1, the bottom electrode 131 is electrically coupling to the first $N^{th}$ metal line 121A'.

In some embodiments as shown in the MRAM cell region 100A of FIG. 1, a cap 150 is on the top electrode 133. The cap 150 can be composed of Ti, Ta, TiN, TaN, W, Ru or combinations thereof. In some embodiments, the cap 150 is formed on the top electrode 133 in order to prevent the occurrence of short circuit between the upper metal, that is, the $(N+1)^{th}$ metal via 124A, and the MTJ 135. In some embodiments, a planarization operation, such as a CMP operation, may be applied to a top surface of the cap 150. In some embodiments, the material of the cap 150 is different from that of the top electrode 133. In some embodiments, the thickness of the cap 150 is in a range of from about 5 nm to about 30 nm.

In some embodiments, the cap 150 possesses a width D1. In some embodiments, a top surface of the MTJ 135 possesses a width D2 and a bottom surface of the MTJ 135 possesses a width D3. In some embodiments, a ratio of a width D1 of the cap 150 and a width D3 of the bottom surface of the MTJ 135 is in a range of from about 1.2 to about 2. In some embodiments, a ratio of a width D2 of the top surface of the MTJ 135 and the width D3 of the bottom surface of the MTJ 135 is in a range from about 0.6 to about 0.96. In some embodiments, the width D1 is greater than the width D2 and in a specific ratio range in order to effectively prevent the short circuit between the $(N+1)^{th}$ metal via 124A and the MTJ 135.

In some embodiments, referring to FIG. 1, a spacer 128 laterally surrounds the MTJ structure 130 from side walls thereof and forms a hollow cylinder feature viewing from a top view perspective (not shown). In some embodiments, the spacer 128 possesses a thickness D4. In some embodiments, a ratio of a thickness D4 of the spacer 128 and the width D3 of the bottom surface of the MTJ 135 is in a range of from about 0.1 to about 0.6. Thus, the width D1 can provide a wider process window for the $(N+1)^{th}$ metal via 124A landing and prevent the $(N+1)^{th}$ metal via 124A from shifting problem. In some embodiments, the spacer 128 can be composed of SiC, SiN, SiON, SiOC or combinations thereof. In some embodiments, the spacer 128 may be formed by a variety of techniques, e.g., CVD, PVD or an atomic layer deposition (ALD) operation.

In some embodiments as shown in the MRAM cell region 100A of FIG. 1, the $(N+1)^{th}$ metal via 124A is partially surrounded by a first stop layer 151 and a cap 150 in addition to being surrounded by the IMDs 127. In some embodiments, the first stop layer 151 can be disposed over the cap 150, and surrounding the $(N+1)^{th}$ metal via 124A. In some embodiments, the cap 150 is positioned between the first stop layer 151 and the top electrode 133. In some embodiments, the first stop layer 151 can be composed of SiC, SiN, SiOC, SiON or combinations thereof. In some embodiments, the $(N+1)^{th}$ metal via 124A has a first height T1. As shown in FIG. 1, a sidewall of the MTJ 135 is protected by the spacer 128 such as a nitride layer. In some embodiments, the spacer 128 includes silicon nitrides. In some embodiments, a dielectric layer 129 can be disposed over the spacer 128.

In some embodiments as shown in the logic region 100B of FIG. 1, the $(N+1)^{th}$ metal via 124B in the logic region 100B is partially surrounded by a second stop layer 152 in addition to being surrounded by the IMDs 127 and the $(N+1)^{th}$ metal line 123' in the logic region 100B is surrounded by the IMDs 127 only. In some embodiments, the second stop layer 152 can be disposed over the $(N+1)^{th}$ metal line 123', and surrounding the $(N+1)^{th}$ metal via 124B. In some embodiments, the second stop layer 152 can be composed of SiC, SiN, SiOC, SiON or combinations thereof. In some embodiments, the $(N+1)^{th}$ metal via 124B has a second height T2. In some embodiments, the stop layers, for example the first stop layer 151 and the second stop layer 152, are resistant to the etchant during an etch operation removing dielectric layer 127. The etch operation is stopped at the top surfaces of the stop layers. In some embodiments, the etch operation in the present embodiment includes reactive ion etch (RIE) adopting fluorine-containing gases. The etch operation is conducted using a suitable etchant, such as fluorine-containing gases or $CF_4$, $CHF_3$, $CH_2F_2$, Ar, $N_2$, $O_2$ and He.

Comparing the MRAM cell region 100A and the logic region 100B, the first height T1 of the $(N+1)^{th}$ metal via 124A is greater than the second height T2 of the $(N+1)^{th}$ metal via 124B. In some embodiments, the $(N+1)^{th}$ metal via 124A and the $(N+1)^{th}$ metal via 124B are formed at the same operation, for example, a single dual Damascene operation over the MRAM cell region 100A and the logic region 100B. In some embodiments, the first stop layer 151 and the second stop layer 152 are non-coplanar or not at the same elevation level. In some embodiments, a bottom surface of the second stop layer 152 is higher than a top surface of the first stop layer 151 by a vertical difference VD. In some embodiments, referring to FIG. 1, the first height T1 is greater than the second height T2, in addition, the first stop layer 151 in the MRAM cell region 100A and the second stop layer 152 in the logic region 100B are formed at different operations. For example, the first stop layer 151 in the MRAM cell region 100A is formed prior to the second stop layer 152 is formed in the logic region 100B. Therefore, the second stop layer 152 in the logic region 100B and the first stop layer 151 in the MRAM cell region 100A are not at the same elevation level. In some embodiments, a removal operation of the first stop layer 151 originally formed at the logic region 100B and a removal operation of the second stop layer 152 originally formed at the MRAM cell region 100A may be conducted during the manufacturing of the semiconductor structure 10. In some embodiments, a thickness of the MTJ structure 130 (including the upper electrode 133, the lower electrode 131B, and the MTJ layer 135) is referred to a third height T3. In some embodiments, a distance measured from the second stop layer 152 to the barrier layer 140 is referred to a height T4. In some embodiments, a ratio of the thickness T3 of the MTJ structure 130 and the height T4 is in a range of from about 0.3 to about 0.75. In some embodiments, a ratio of the vertical difference VD and the thickness T3 is in a range from about 0.2 to about 2.

In some embodiments, the bottom electrode 131 of the MTJ structure 130 is electrically coupled with the doped region. In some embodiments, the doped region is a drain 105 or a source 103. In other embodiments, the bottom electrode 131 of the MTJ structure 130 is electrically coupled with the gate 107. In some embodiments, the gate 107 of the semiconductor structure 10 can be a polysilicon gate or a metal gate.

Figure 2:
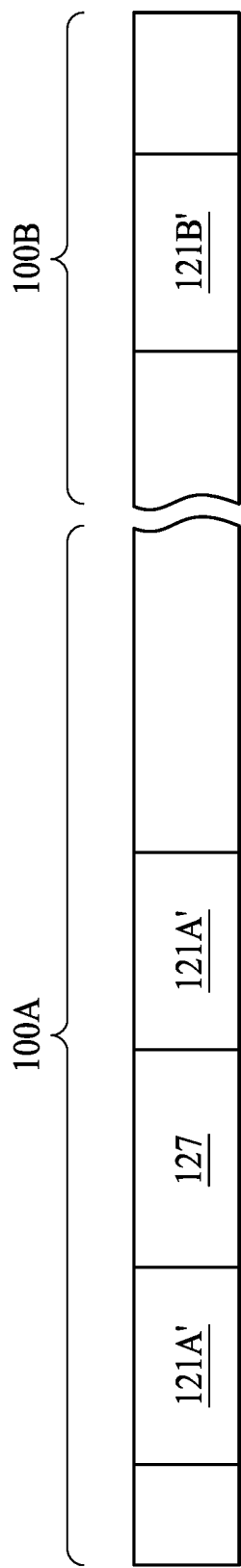
FIG. 2 to FIG. 24 are cross sections of a semiconductor structure fabricated at various stages, in accordance with some embodiments of the present disclosure.

FIG. 2 to FIG. 24 are cross sections of a CMOS structure fabricated at various stages, in accordance with some embodiments of the present disclosure. In FIG. 2, a semiconductor structure having a predetermined MRAM cell region 100A and a logic region 100B is provided. In some embodiments, a transistor structure is pre-formed in a semiconductor substrate (not shown in FIG. 2). The integrated circuit device may undergo further CMOS or MOS technology processing to form various features known in the art. For example, one or more contact plugs, such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

A first $N^{th}$ metal line 121A' is patterned in a dielectric layer 127 over the transistor structure in the MRAM cell region 100A. A second $N^{th}$ metal line 121B' is patterned in a dielectric layer 127 over the transistor structure in the logic region 100B. The first and the second $N^{th}$ metal lines 121A' and 121B' (collectively the "$N^{th}$ metal line") are formed concurrently through a single patterning operation. In some embodiments, the $N^{th}$ metal line can be formed of an electroplating operation with a Cu seed layer deposited over the patterned dielectric layer 127. In other embodiments, the $N^{th}$ metal line may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line and the top surface of the dielectric layer 127.

Figure 3:
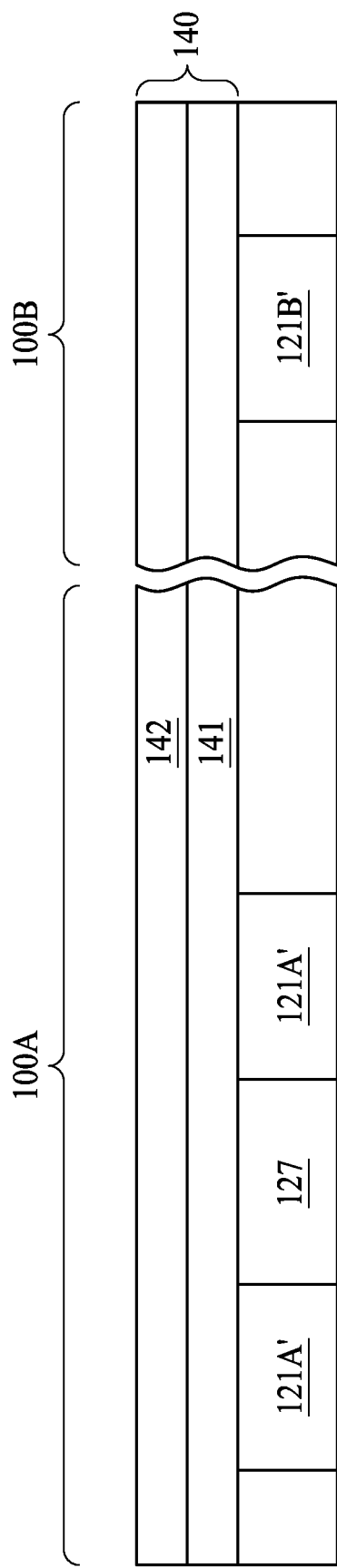
Figure 4:
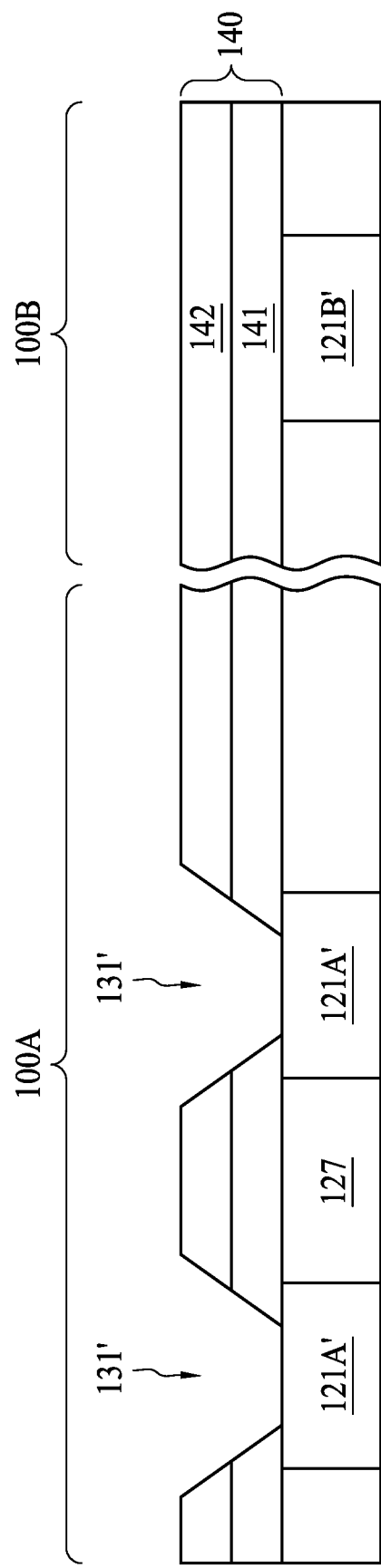

In FIG. 3, a barrier layer 140 in a form of a stacking layer including a SiC layer 141 and a TEOS/SRO layer 142 are blanket deposited over a top surface of the $N^{th}$ metal line and a top surface of the dielectric layer 127, in both the MRAM cell region 100A and the logic region 100B. The barrier layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like. In FIG. 4, a photoresist layer (not shown) is patterned over the stacking layer to expose a bottom electrode region of the MTJ structure. As shown in FIG. 4, a bottom electrode via hole 131' is formed in the barrier layer 140 by a suitable dry etch operation. In some embodiments, the dry etch in the present operation includes reactive ion etch (RIE) adopting fluorine-containing gases. In some embodiments, the present dry etch operation can be any suitable dielectric etch to form via trenches in a metallization structure of conventional CMOS technology. Referring to the logic region 100B as shown in FIG. 4, the barrier layer 140 is protected by the photoresist layer (not shown) such that a top surface of the second $N^{th}$ metal line 121B' is not exposed as opposed to the counterpart in the MRAM cell region 100A.

Figure 5:
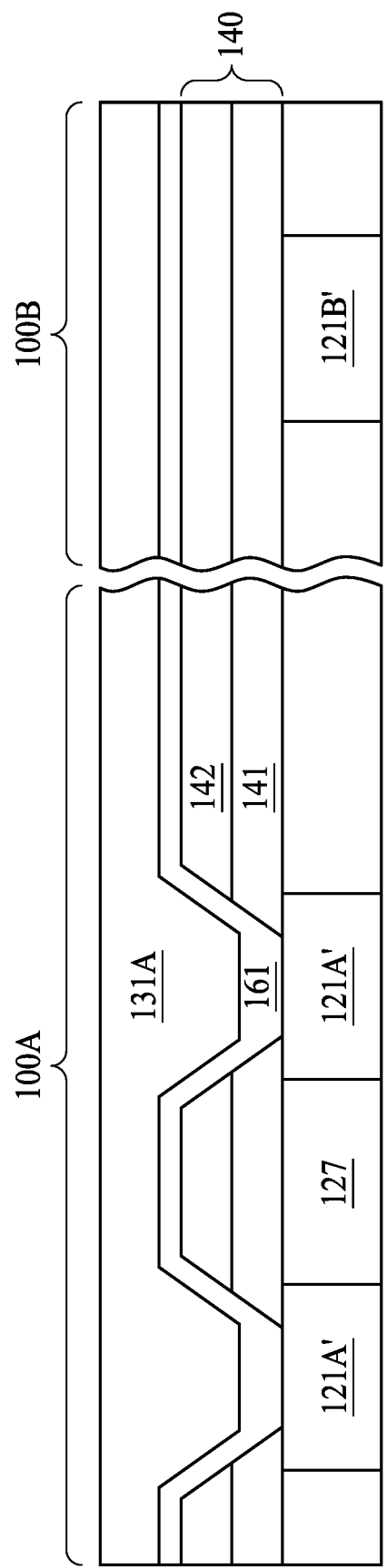
Figure 6:
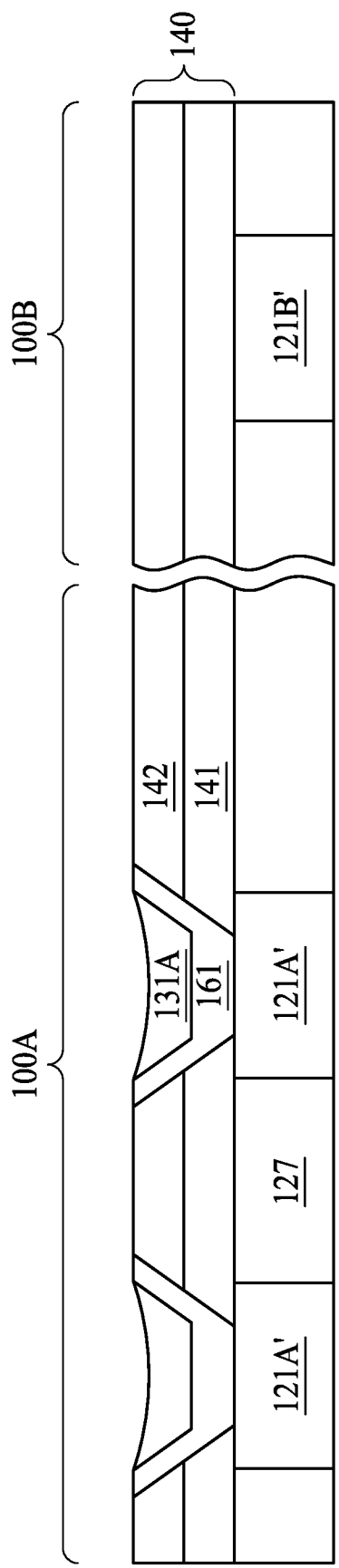
Figure 7:
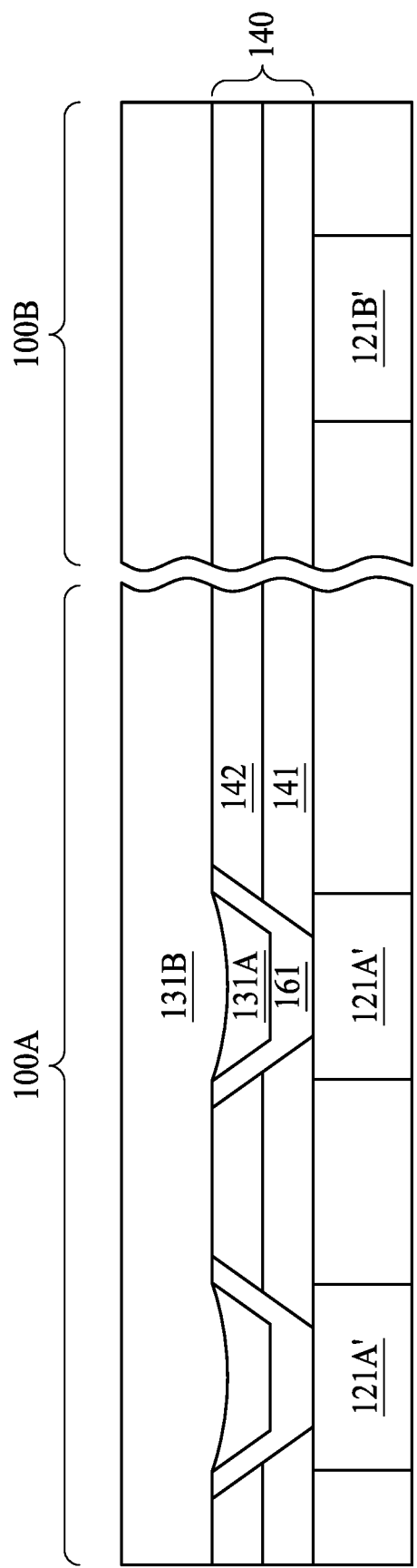
Figure 8:
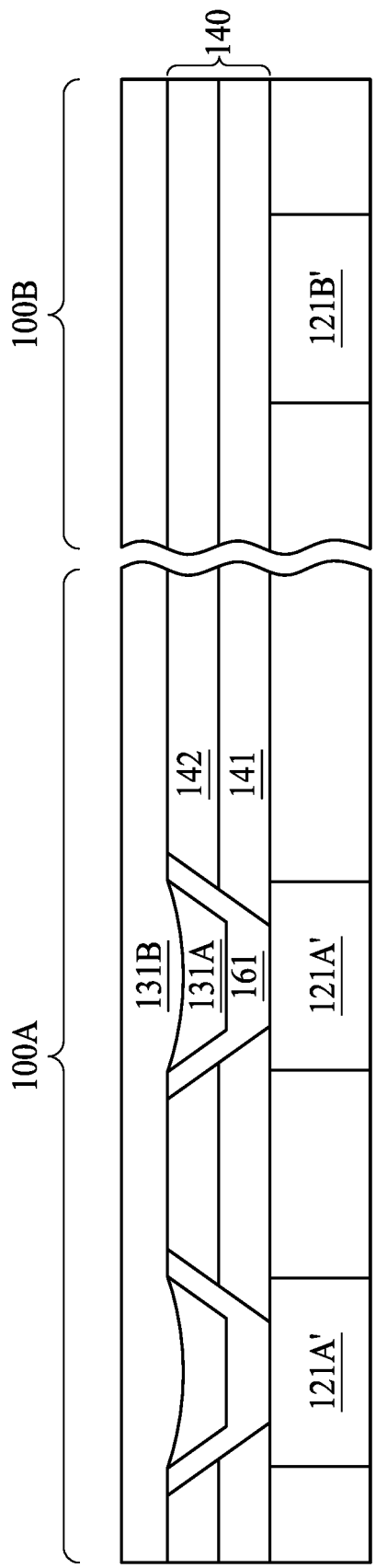

In FIG. 5, a diffusion barrier layer 161 is blanket lined over the bottom electrode via hole 131' in the MRAM cell region 100A and over the barrier layer 140 in the logic region 100B. Subsequently, a first deposition of bottom electrode material 131A is conducted to be disposed over the diffusion barrier layer 161 and the barrier layer 140. The first deposited bottom electrode material 131A is then etched back to level with a top surface of the barrier layer 140, as illustrated in FIG. 6. In FIG. 7, a second deposition of bottom electrode material 131B is blanket formed over the first deposited bottom electrode material 131A and the barrier layer 140. The second deposited bottom electrode material 131B is then thinned to a predetermined thickness, as illustrated in FIG. 8.

Figure 9:
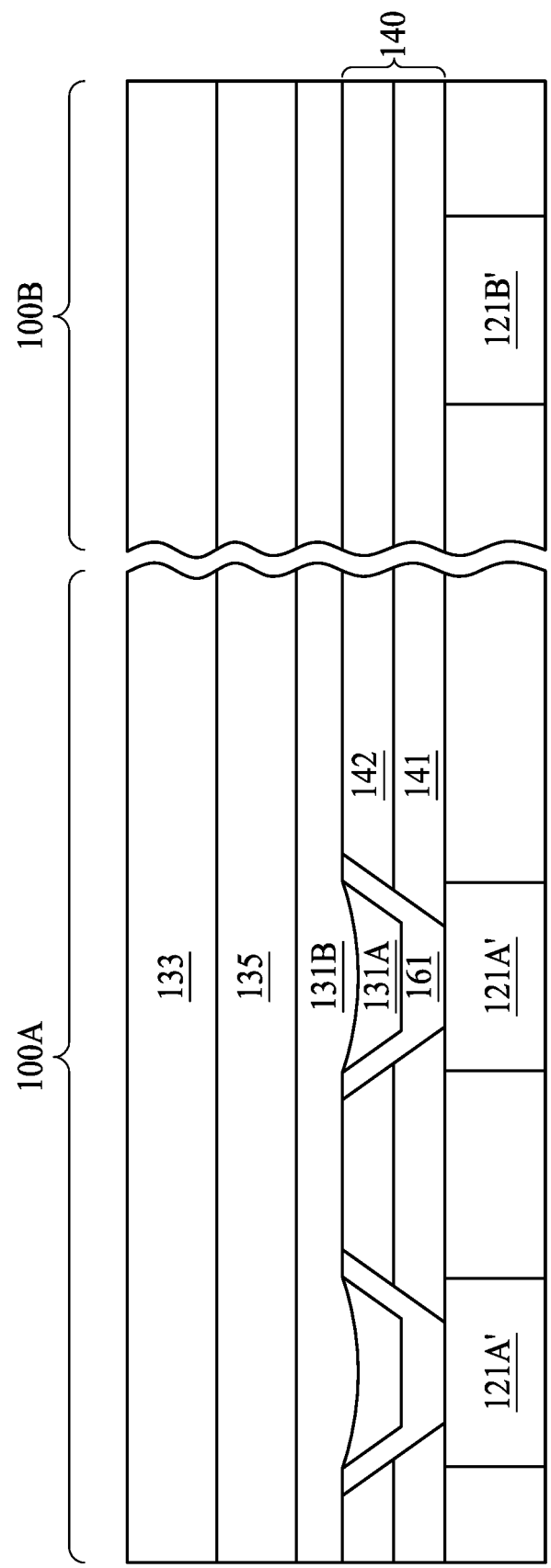

FIG. 9 shows the top electrode formation of an MTJ structure. In FIG. 9, an MTJ 135 is deposited in a form of multiple material stacks over the bottom electrode 131B. In some embodiments, the MTJ 135 is having a thickness of from about 150 Å to about 300 Å. The MTJ 135 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ 135 may include an antiferromagnetic layer in accordance with other embodiments. Following the formation of the MTJ 135, a top electrode layer 133 is deposited over the MTJ 135. The top electrode layer 133 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 10:
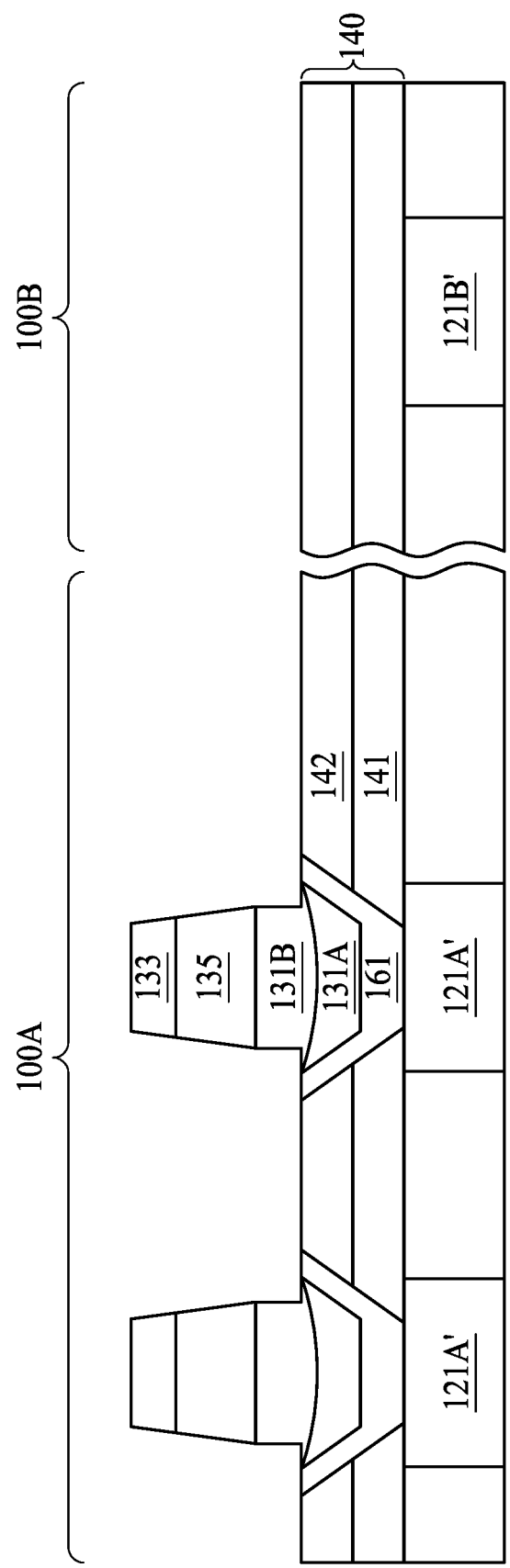

Referring to FIG. 10, the bottom electrode 131A and 131B is formed by a self-aligned manner. For example, a patterned photoresist (not shown) layer is formed over the top electrode 133 in FIG. 9 and an etching operation is carried out to pattern the MTJ structure 130. In turns, the bottom electrode 131A and 131B is formed aligning to the overlying MTJ 135 and the top electrode 133. To elaborate, a mask layer (not shown) exposing a desired MTJ pattern is formed over the top electrode layer 133 for the ensuing MTJ structure formation. The mask layer possessing the desired MTJ pattern in the MRAM cell region 100A and may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ 135, the top electrode 133, and the second deposited bottom electrode 131B. For example, a width of the masking region is determined according to the desired MTJ diameter. In some embodiments, the MTJ 135 and the top electrode 133 are formed by an RIE to have a trapezoidal shape viewing from a cross section.

Figure 11:
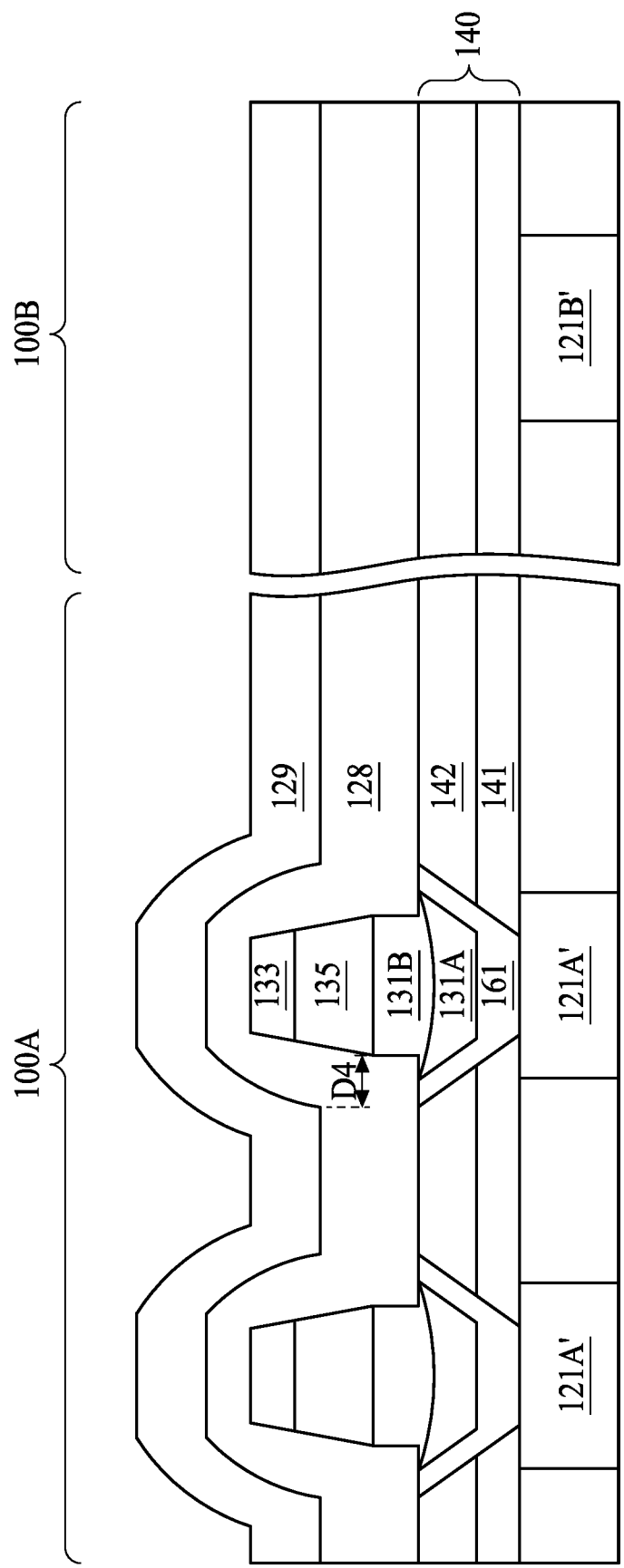

In FIG. 11, a spacer 128 is conformally formed over the bottom electrode 131, the MTJ 135, and the top electrode 133. In some embodiments, the spacer 128 possesses a thickness D4. Note a sidewall of the MTJ 135 and the sidewall of the second deposited bottom electrode 131B are surrounded by the spacer 128 to prevent oxidation or other contamination. Subsequently, a dielectric layer 129 such as a TEOS layer or an inter metal dielectric (IMD) layer is conformally deposited over the spacer 128. In some embodiments, a ratio of the thickness D4 to a width of the bottom surface of the MTJ 135 is in a range of from about 0.1 to about 0.6 to achieve optimal oxidation and contamination prevention.

Figure 12:
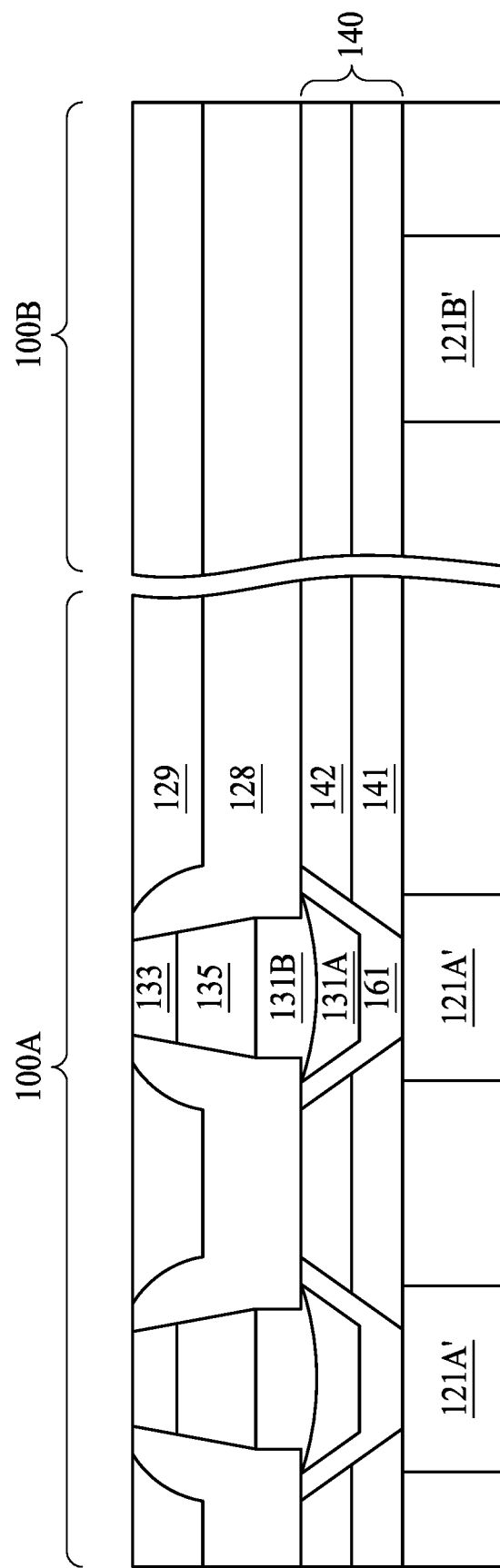

In FIG. 12, a planarization operation is performed on the dielectric layer 129 such that the top surface of the dielectric layer 129 is substantially flat across the MRAM cell region 100A and the logic region 100B. As shown in FIG. 12, the top surface of the top electrode 133 is exposed from the dielectric layer 129 after an etch back operation. In some embodiments, etch back operation includes a chemical mechanical polishing (CMP).

Figure 13A:
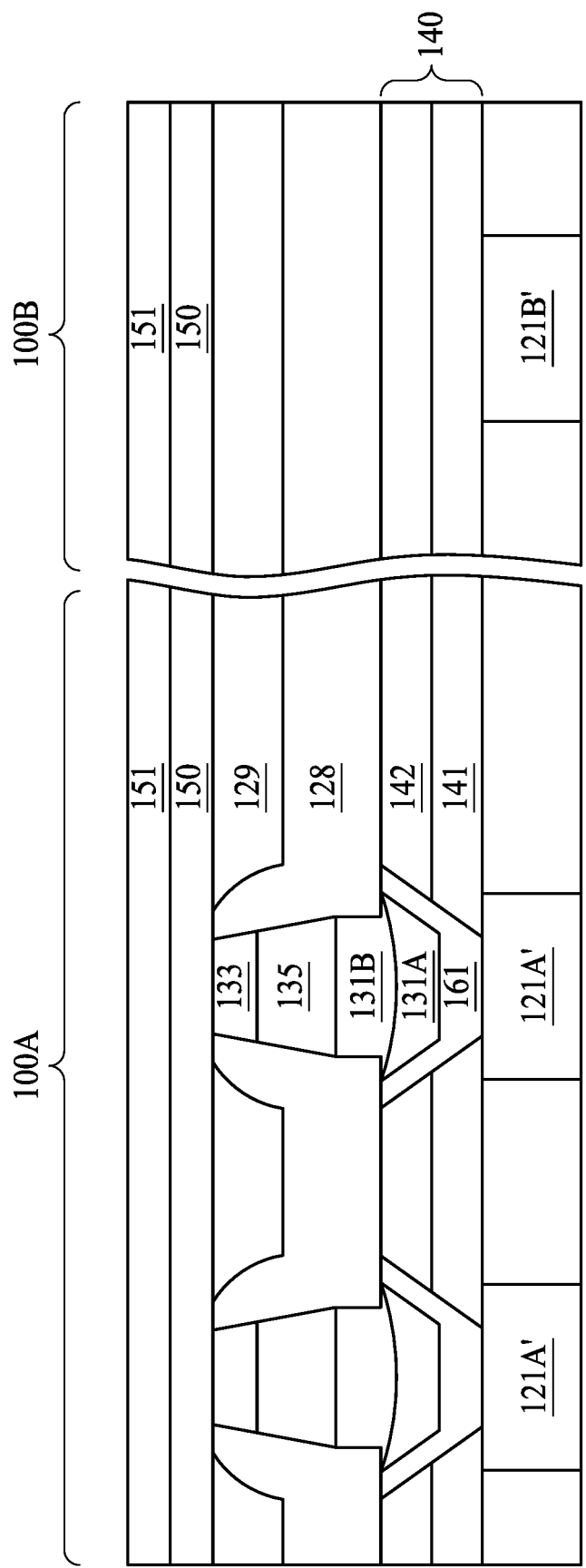

In FIG. 13A, a deposition of a cap 150 is blanket formed over the top surface of the top electrode 133 and the barrier layer 140 in the MRAM cell region 100A and over the top surface of the dielectric layer 129 in the logic region 100B. The deposited cap 150 can be composed of Ti, Ta, TiN, TaN, W, Ru or combinations thereof. In some embodiments, the cap 150 can be deposited to a predetermined thickness by a variety of techniques, e.g., CVD, PVD or ALD operation. Alternatively, the cap 150 can be deposited to a first thickness by a chemical vapor deposition (CVD) operation and then be thinned by a CMP operation to a predetermined thickness. In some embodiments, the predetermined thickness of the cap 150 is in a range from about 5 nm to about 30 nm. As shown in FIG. 13A, a deposition of a first stop layer 151 is blanket formed over the cap 150 in the MRAM cell region 100A and the cap 150 in the logic region 100B. The deposited first stop layer 151 can be composed of SiC, SiN, SiOC, SiON or combinations thereof. In some embodiments, the first stop layer 151 can be deposited by CVD or ALD operation. In some embodiments, the predetermined thickness is in a range of from about 5 nm to about 40 nm.

Figure 13B:
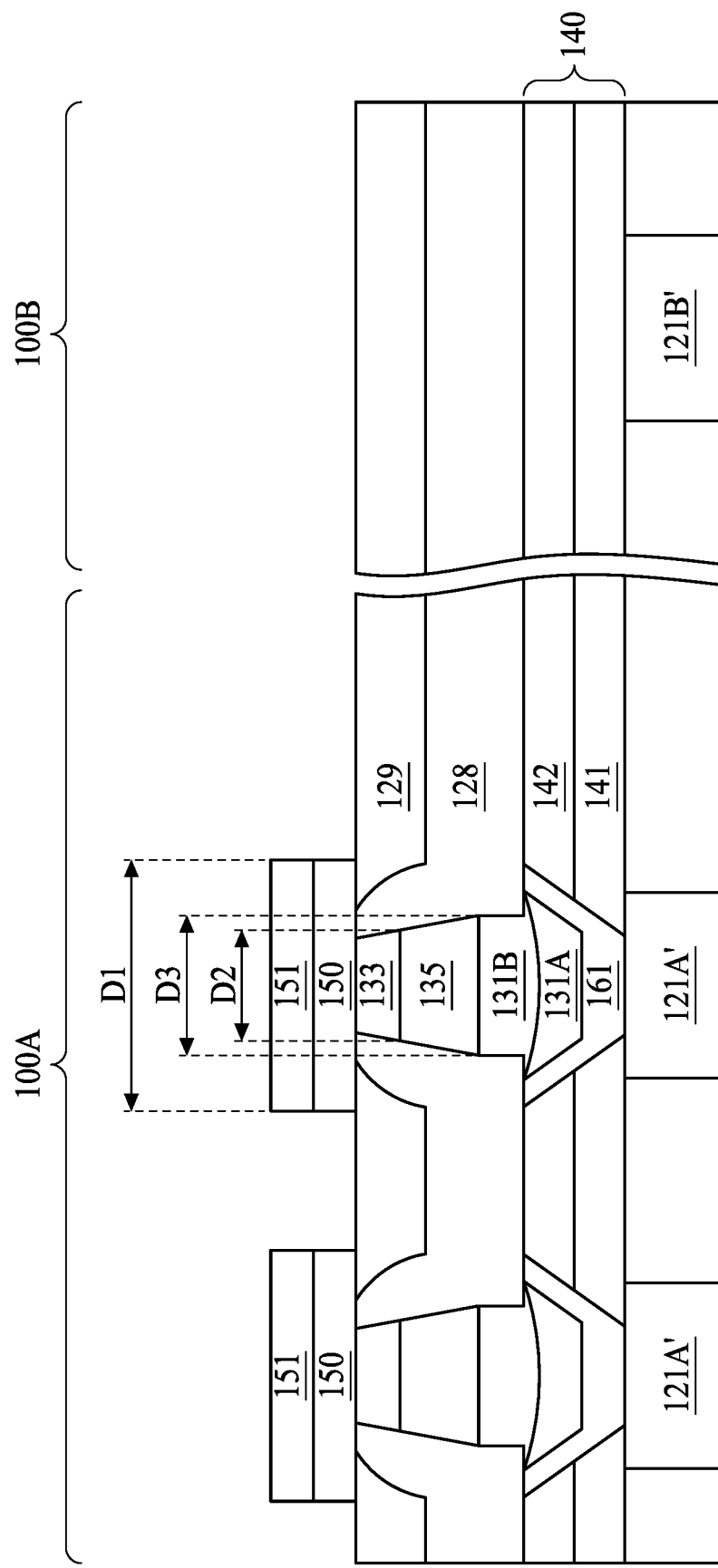

In FIG. 13B, the cap 150 and the first stop layer 151 at the logic region 100B is removed through lithography operations. Meanwhile, the cap 150 and the first stop layer 151 at the MRAM cell region 100A is patterned to form a localized cap 150 and first stop layer 151 covering the MTJ structure 130. In some embodiments, the cap 150 and the first stop layer 151 over one MTJ structure 130 is electrically isolated from the cap 150 and the first stop layer 151 over another adjacent MTJ structure 130.

Following FIG. 13B, in some embodiments, the critical dimensions (CD) of the cap 150 and the MTJ 135 are determined to be in a range so that allowing the cap 150 to provide optimal protection to the underlying MTJ 135 memory structure. For example, the width of the cap 150 shall be at least greater than the maximum width of the MTJ 135. Moreover, in some embodiments, the width of the cap 150 shall be at least greater than the maximum width of the MTJ 135 plus the spacer 128 laterally surrounding the MTJ 135. In some embodiments, the cap 150 possesses a width D1, a top surface of the MTJ 135 possesses a width D2 and a bottom surface of the MTJ 135 possesses a width D3. In some embodiments, a ratio of a width D1 of the cap 150 and a width D3 of the bottom surface of the MTJ 135 is in a range of from about 1.2 to about 2. In some embodiments, a ratio of a width D2 of the top surface of the MTJ 135 and the width D3 of the bottom surface of the MTJ 135 is in a range of from about 0.6 to about 0.96. In some embodiments, the stop layers, for example the first stop layer 151, is resistant to the etchant during an etch operation to remove dielectric layer subsequently formed. The etch operation is stopped at the top surfaces of the stop layers. In some embodiments, the etch operation in the present embodiment includes reactive ion etch (RIE) adopting fluorine-containing gases. The etch operation is conducted using a suitable etchant, such as $CF_4$, $CHF_3$, $CH_2F_2$, Ar, $N_2$, $O_2$ and He.

Figure 14:
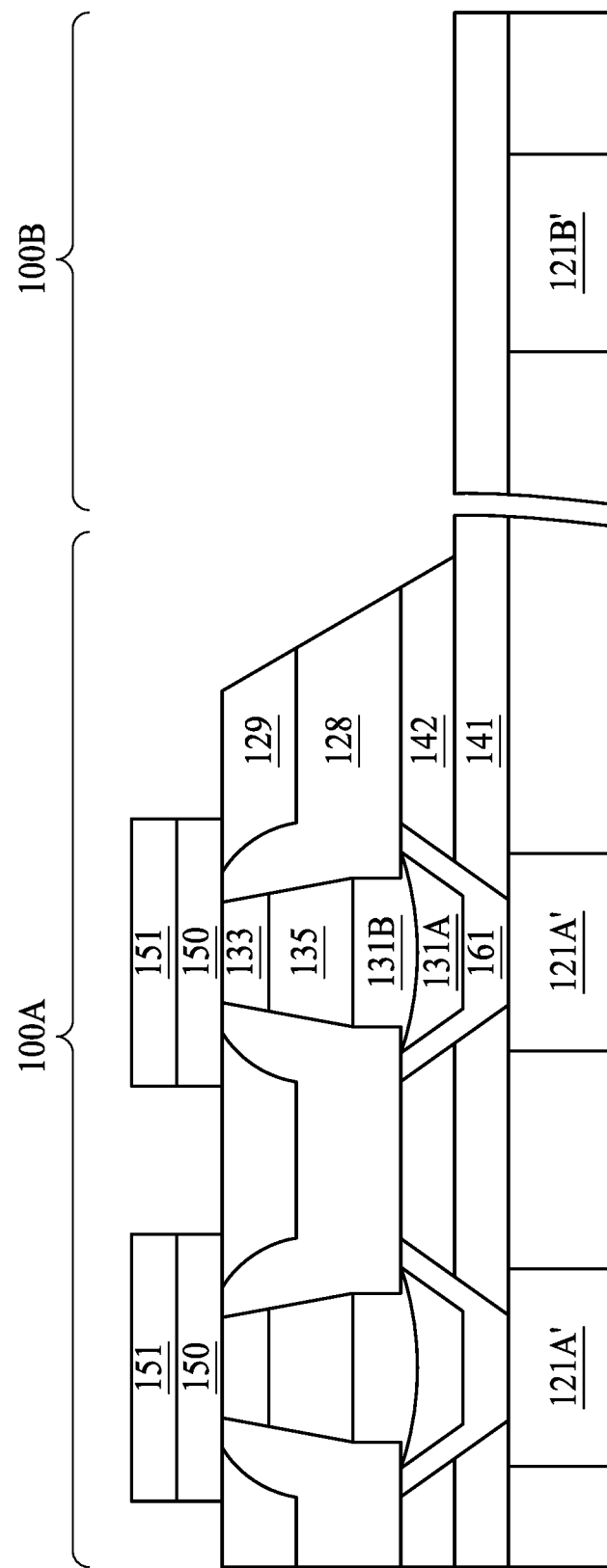
Figure 15:
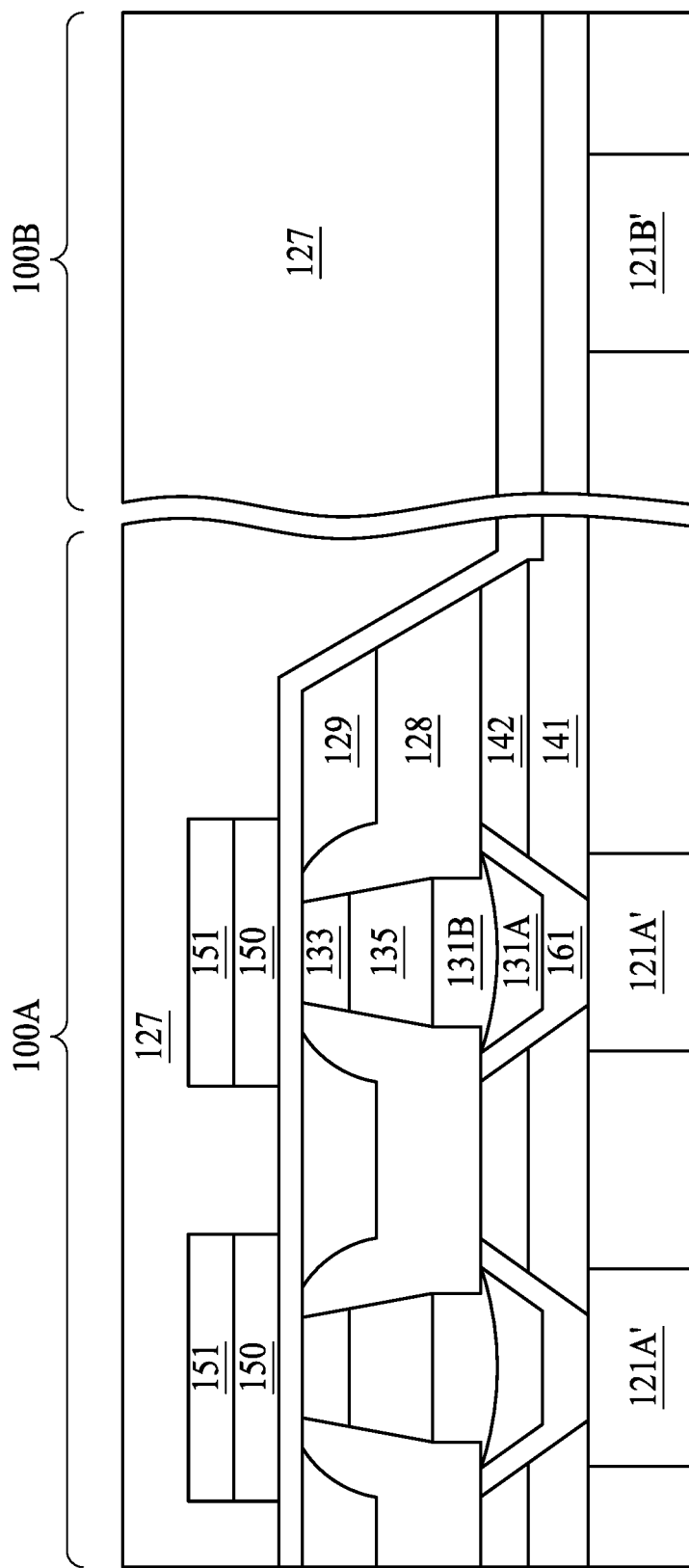

As shown in FIG. 14, the dielectric layer 129, the spacer 128, and the barrier layer 140 are removed by a suitable dry etch operation in the logic region 100B. Referring to the logic region 100B as shown in FIG. 14, the cap 150 and the first stop layer 151 in the MRAM cell region 100A is protected by the photoresist layer (not shown) such that a top surface of the first stop layer 151 is not exposed as opposed to the counterpart in the logic region 100B. In FIG. 14, an upper portion of the barrier layer 140, the spacer 128, the dielectric layer 129, the cap 150, and the first stop layer 151 are removed from the logic region 100B through an etch back operation, as illustrated in FIG. 14. Hence, the MRAM cell region 100A is in greater height than the logic region 100B. In FIG. 15, a low-k dielectric layer 127 is formed to cover the MRAM cell region 100A and the logic region 100B. In some embodiments, a substantially coplanar surface of the low-k dielectric layer 127 is formed over the MRAM cell region 100A and the logic region 100B. An etch back operation is performed to obtain a substantially flat top surface of the low-k dielectric layer 127 for the following trench formation in the logic region 100B.

Figure 16:
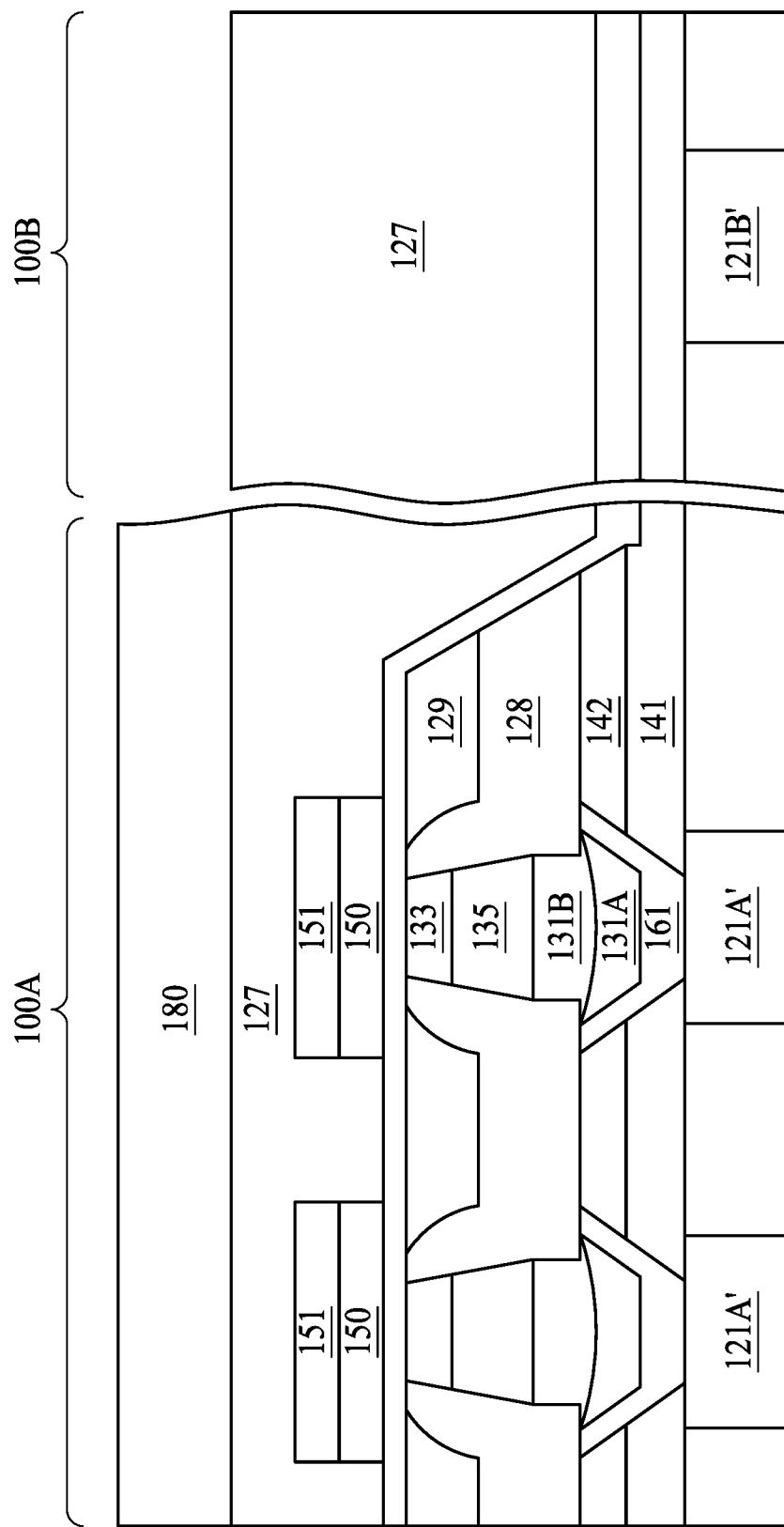

As shown in FIG. 16, a photoresist layer 180 is patterned over the MRAM cell region 100A and exposing the logic region 100B. Conventionally, the metal trench formation is conducted both in the MRAM cell region 100A and the logic region 100B, such that, for example, an $N^{th}$ metal via trench is formed in the low-k dielectric layer 127 of the logic region 100B, and an $(N+1)^{th}$ metal line trench is formed in the low-k dielectric layer 127 of the logic region 100B. However, in the present disclosure, both the $N^{th}$ metal via trench and the (N+1)th metal line trench are formed in the logic region 100B only, as would be discussed in FIG. 17.

Figure 17:
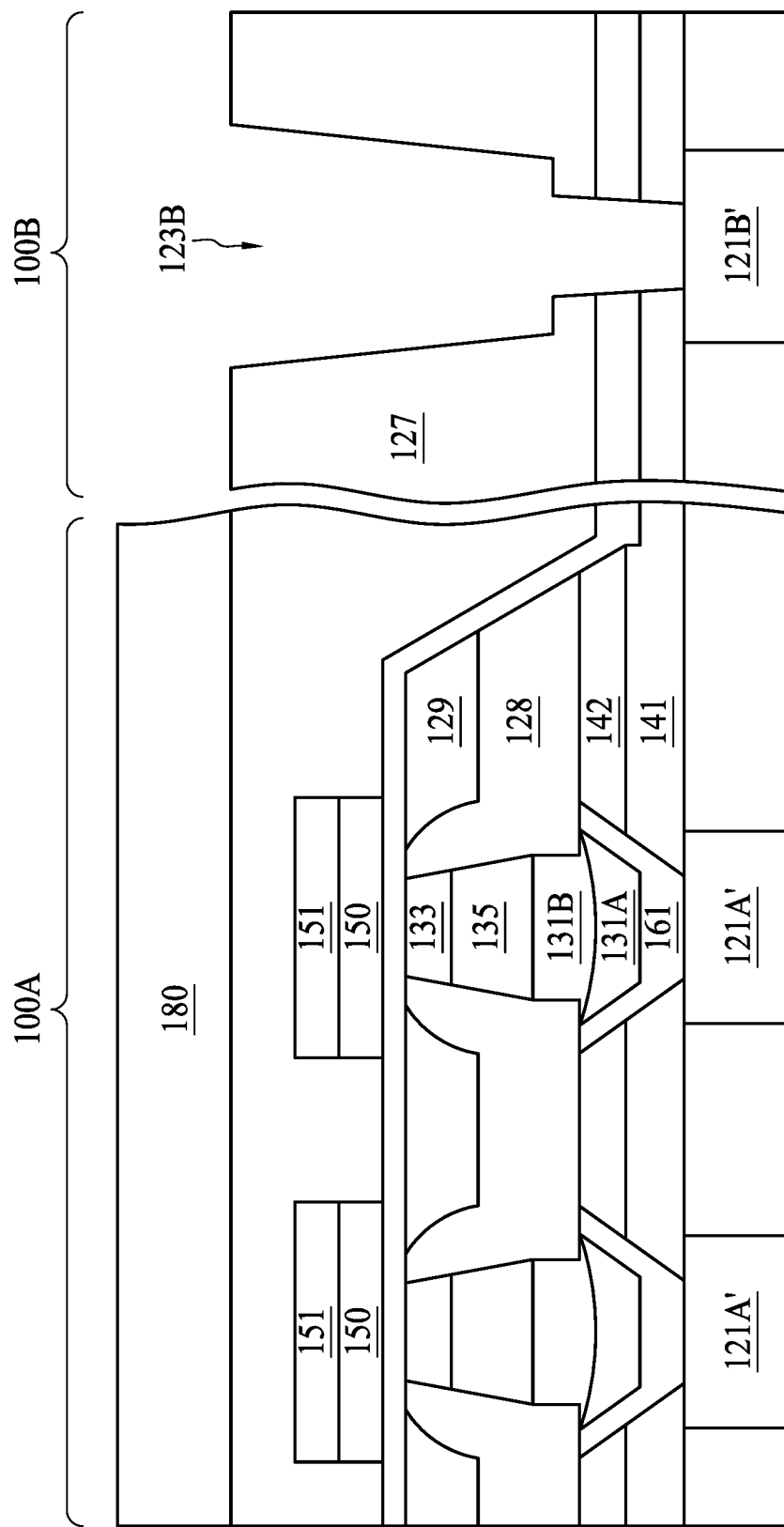

Referring to FIG. 17, no metal trench is formed over the MTJ structure 130, and thus the top surface of the top electrode 133 of the MTJ structure 130 is not exposed and covered by the cap 150 and the first stop layer 151. In the logic region 100B, an $N^{th}$ metal via trench and an $(N+1)^{th}$ metal line trench (combinatory 123B) are formed over the second $N^{th}$ metal line 121B', exposing a top surface of the second $N^{th}$ metal line 121B'.

Figure 18:
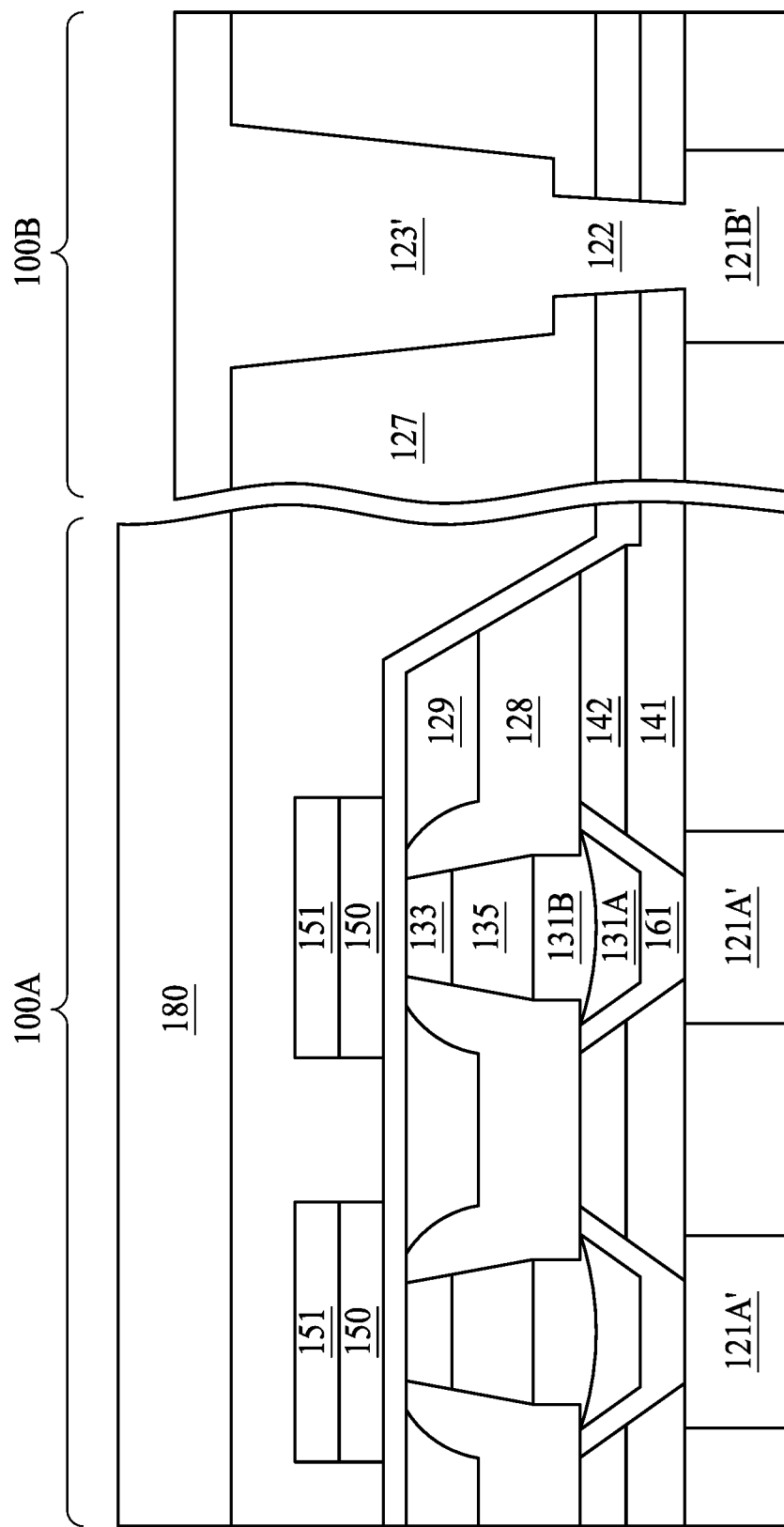
Figure 19:
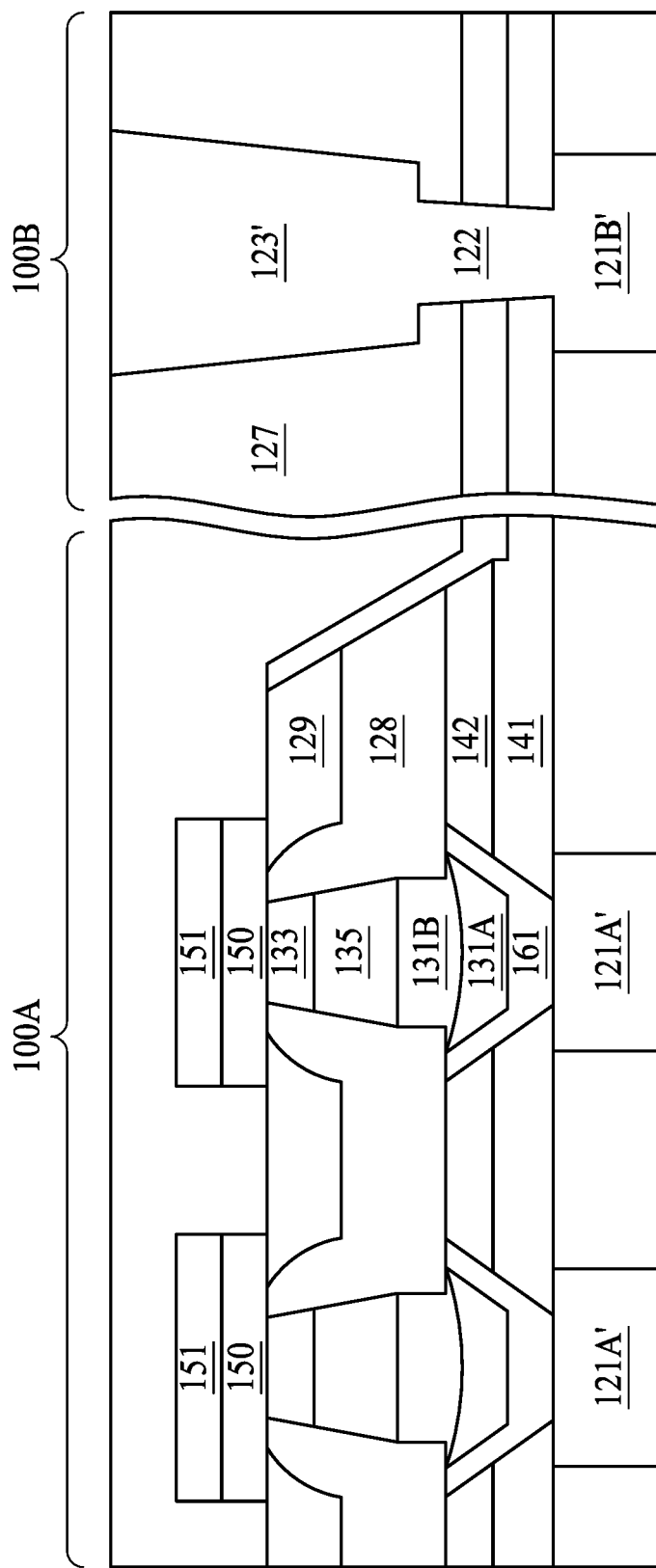

In FIG. 18 and FIG. 19, in the logic region 100 B, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. $N^{th}$ metal via 122 and $(N+M)^{th}$ metal line 123' may be formed from W, and more preferably from copper (Cu), including AlCu (collectively, Cu). In one embodiment, $(N+1)^{th}$ metal lines 123' are formed using the Damascene operation, which should be familiar to those in the art. First, trenches are etched through the low k dielectric layer. This process can be performed by plasma etch operation, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by plasma deposition process, such as physical vapor deposition (PVD) or chemical vapor deposition (CVD) including plasma enhanced chemical vapor deposition (PECVD).

After the planarization operation removing the overburden of the conductive metal as illustrated in FIG. 19, an $(N+1)^{th}$ metal line 123' in the logic region 100B, as well as an $N^{th}$ metal via 122 in the logic region 100B, are formed. Note at the present operation, no metal lines are formed over the first stop layer 151 and the cap 150 over the top electrode 133 of the MTJ structure 130 since the MTJ structure 130 occupies the corresponding elevation level of the $N^{th}$ metal via 122 and the $(N+M)^{th}$ metal line 123' in the logic region 100B.

Figure 20:
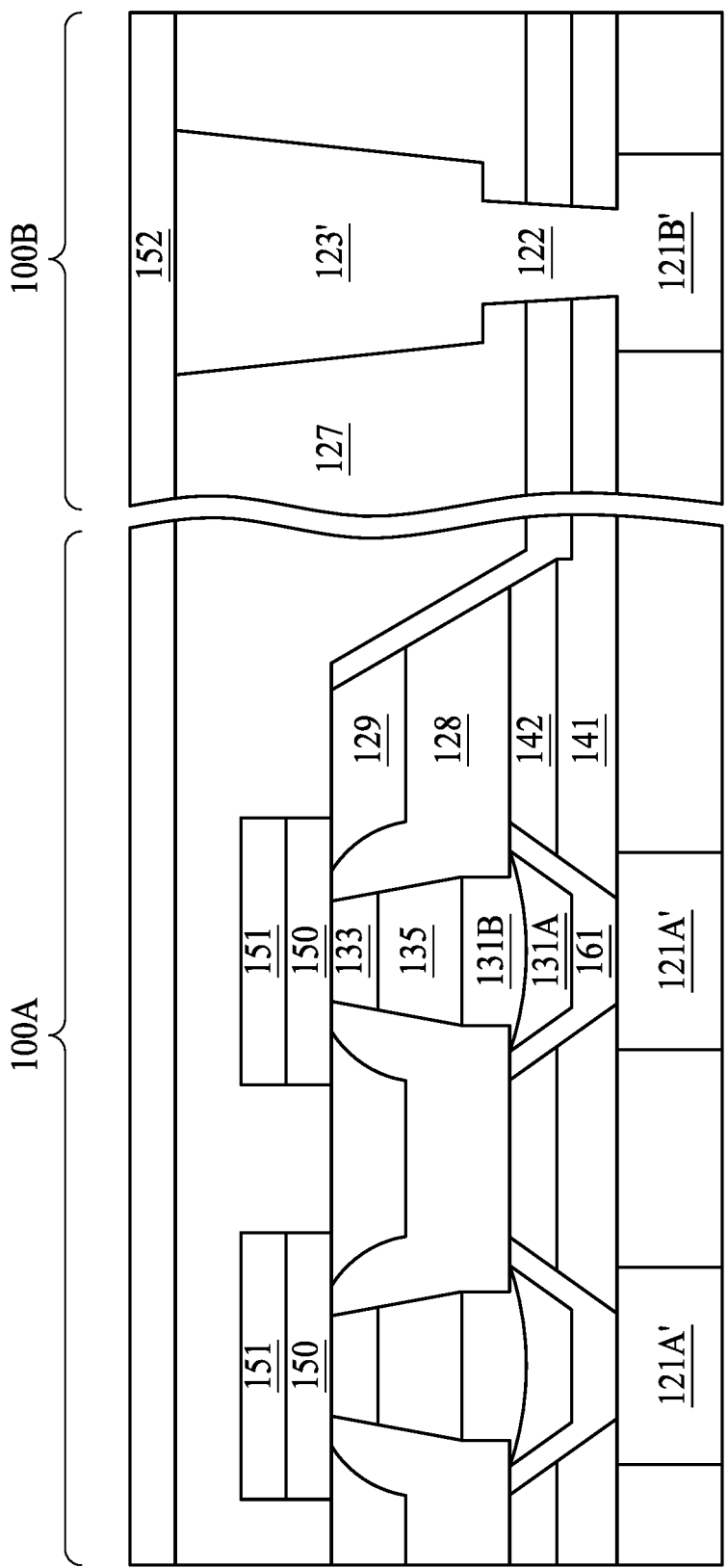
Figure 21:
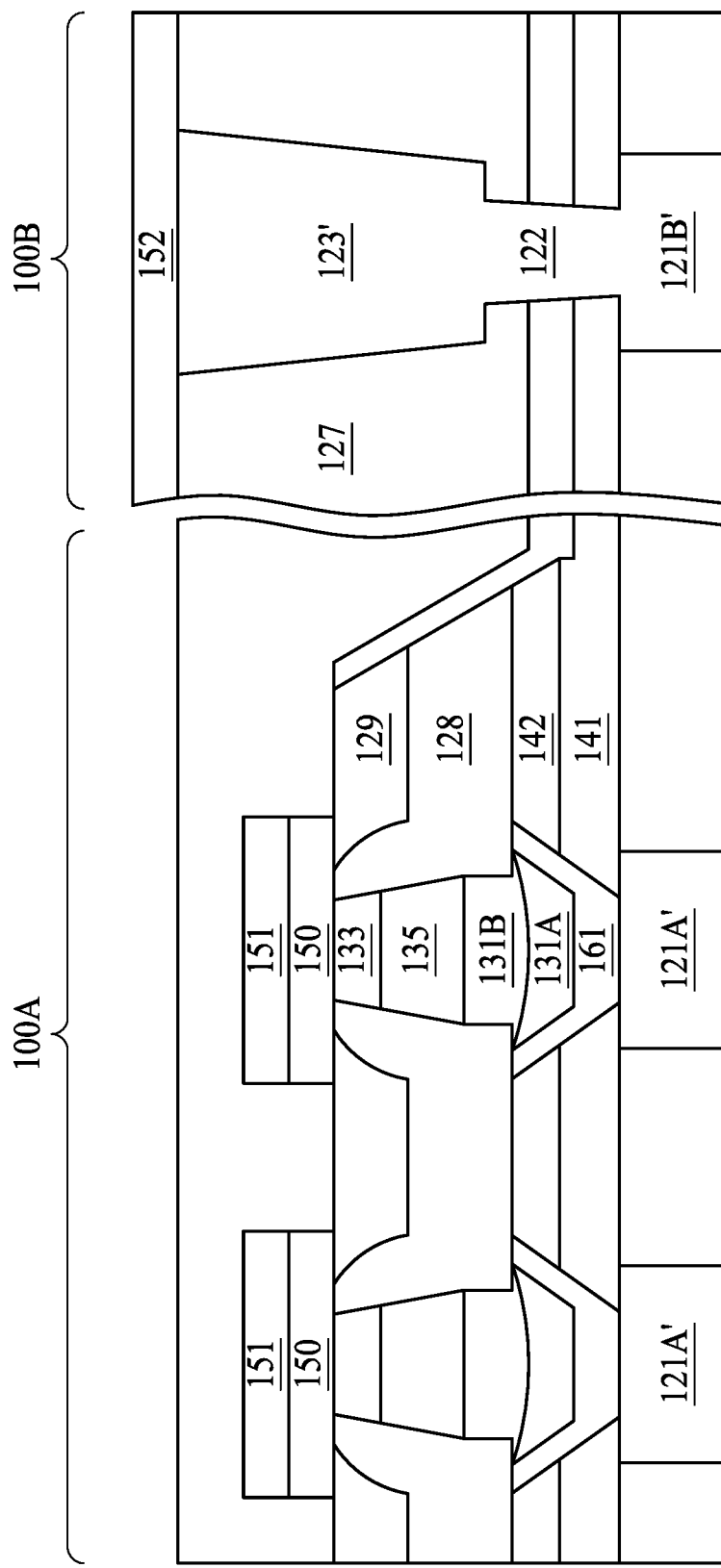

In FIG. 20, note in the MRAM cell region 100A, the cap 150 is in contact with a top surface of the top electrode 133 of the MTJ structure 130 at current operation. As shown in FIG. 20, a deposition of a second stop layer 152 is blanket formed over the first stop layer 151 and the low-k dielectric layer 127 in the MRAM cell region 100A and $(N+1)^{th}$ metal line 123' in the logic region 100B. Note the second stop layer 152 is in direct contact with a top surface of the $(N+1)^{th}$ metal line 123' but not in direct contact with the first stop player 151. The deposited second stop layer 152 may be composed of SiC, SiN, SiOC, SiON or combinations thereof. In some embodiments, the second stop layer 152 can be deposited by CVD or ALD operation. In some embodiments, the predetermined thickness of the second stop layer 152 is in a range of from about 5 nm to about 40 nm. Therefore, as shown in FIG. 20, the first stop layer 151 is non-coplanar with the second stop layer 152. As shown in FIG. 21, the second stop layer 152 is removed from the MRAM cell region 100A through an etch back operation.

Figure 22:
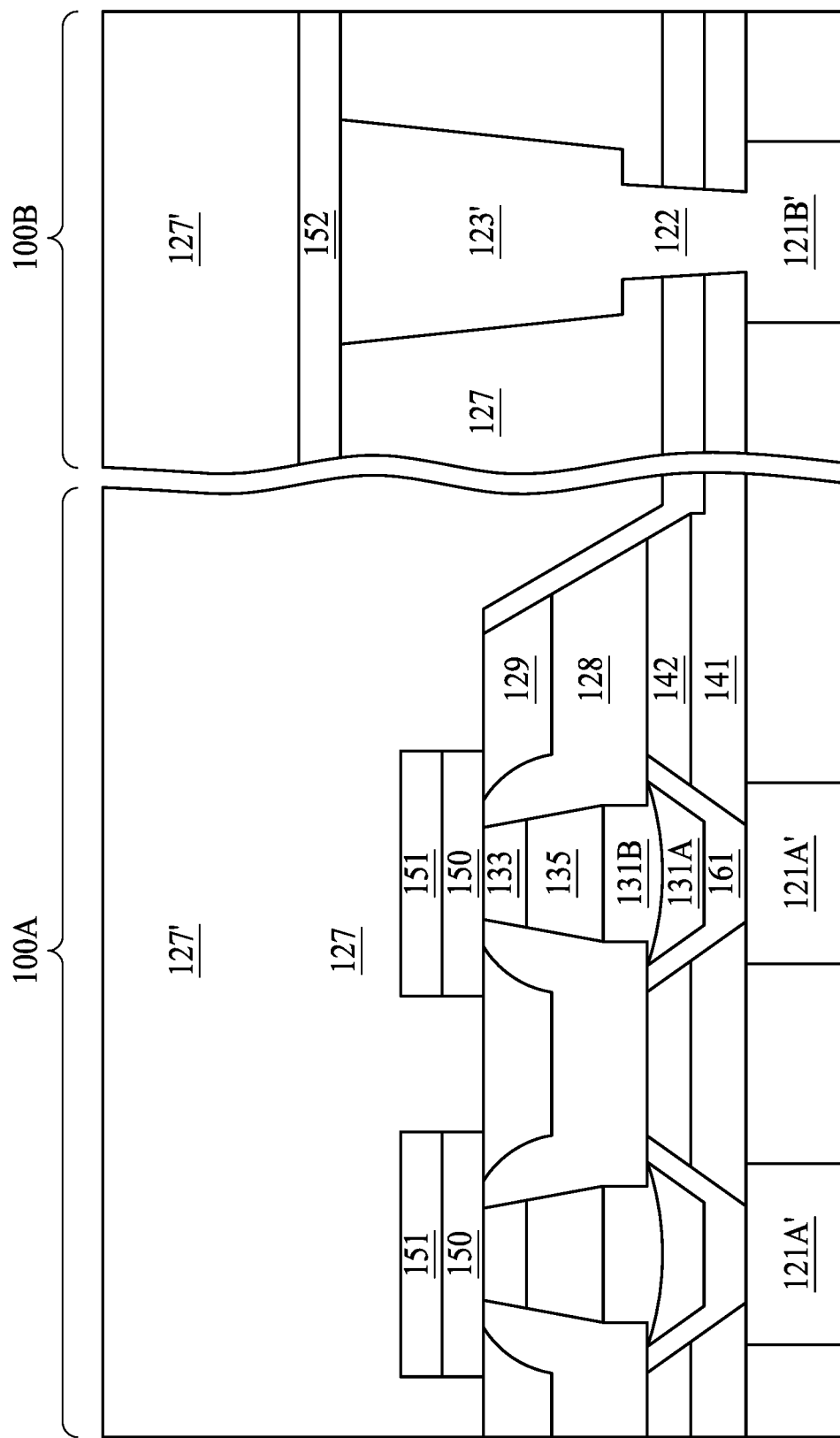
Figure 23:
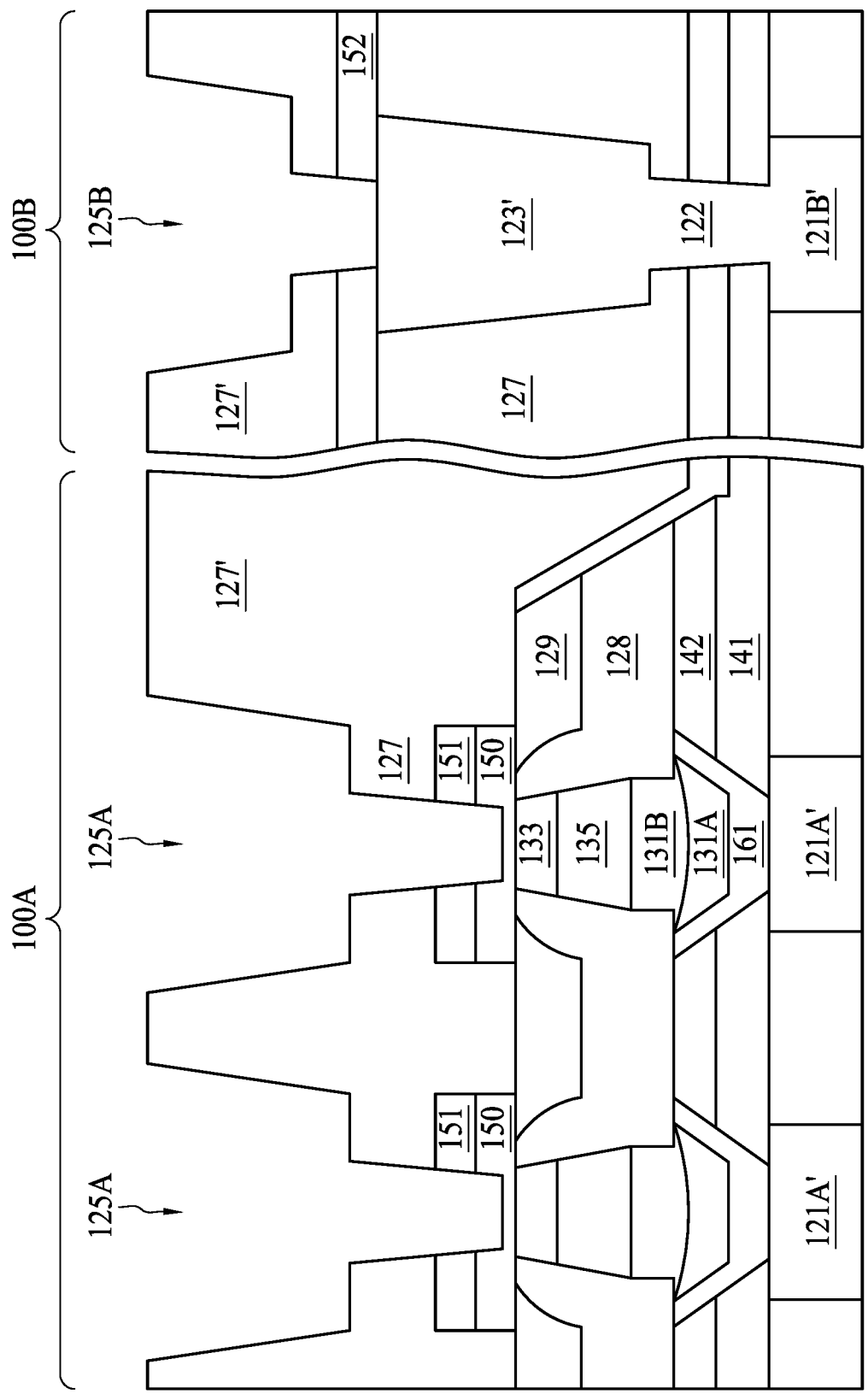
Figure 24:
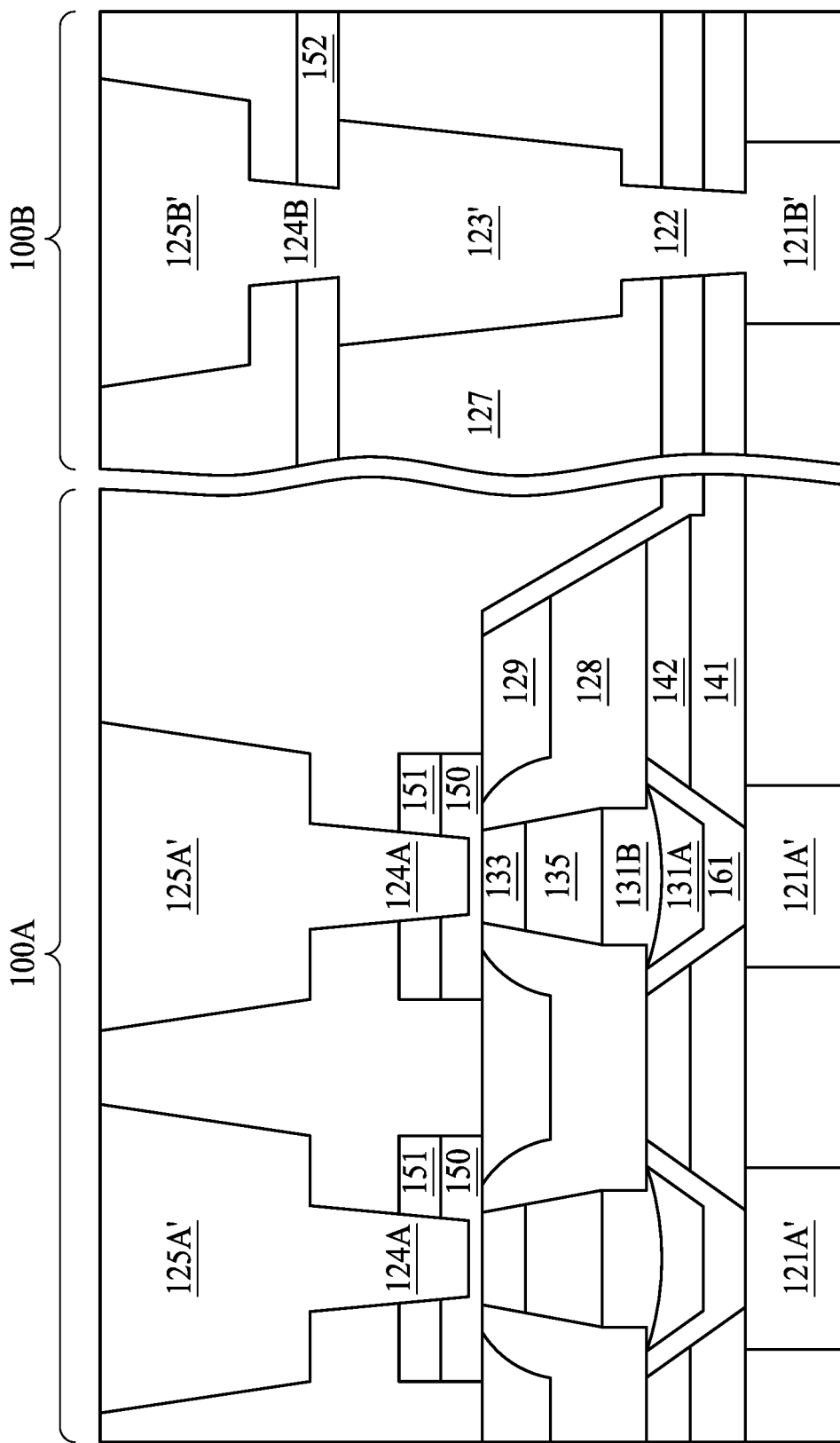

As shown in FIG. 22, a low-k dielectric layer 127' is formed to conformally cover the MRAM cell region 100A and the logic region 100B. In FIG. 23, the $(N+1)^{th}$ metal via hole as well as $(N+2)^{th}$ metal line trench in both the MRAM cell region 100A and the logic region 100B (combinatorily 125A in the MRAM cell region 100A and 125B in the logic region 100B) are formed in the low k dielectric layer 127. Note the $(N+1)^{th}$ metal via hole and $(N+2)^{th}$ metal line trench in the MRAM cell region 100A penetrates through the low k dielectric layer 127 and 127', the first stop layer 151, and stop at the cap 150. Therefore, the top surface of the top electrode 133 is not exposed in the MRAM cell region 100A after the formation of the via hole and the line trench. The $(N+1)^{th}$ metal via hole and $(N+2)^{th}$ metal line trench in the logic region 100B penetrates through the low k dielectric layer 127' and the second stop layer 152, exposing the top surface of the $(N+1)^{th}$ metal line 123'. In FIG. 24, the $(N+1)^{th}$ metal via hole as well as $(N+2)^{th}$ metal line trench are filled with conductive materials as previously described. In some embodiments, the manufacturing operations in both the MRAM cell region 100A and the logic region 100B are substantially identical after the formation of the (N+1)$^{th}$ metal line 123'. The (N+1)$^{th}$ metal vias 124A, 124B and the (N+2)$^{th}$ metal lines 125A' and 125B" are formed in the RAM cell region 100A and the logic region 100B, respectively, in a single Damascene operation.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Some embodiments of the present disclosure provide a semiconductor structure, including a memory region and a logic region adjacent to the memory region. The memory region includes a first N$^{th}$ metal line, a first stop layer being disposed over a magnetic tunneling junction (MTJ) over the first N$^{th}$ metal line, and a first (N+1)$^{th}$ metal via being disposed over the MTJ and surrounded by the first stop layer, the first (N+1)$^{th}$ metal via having a first height. The logic region includes a second N$^{th}$ metal line, a second stop layer being disposed over an (N+1)$^{th}$ metal line, and a second (N+1)$^{th}$ metal via over the (N+1)$^{th}$ metal line and having a second height. N is an integer greater than or equal to 1 and the first height is greater than the second height.

Some embodiments of the present disclosure provide a semiconductor structure, including a memory region and a logic region adjacent to the memory region. The memory region includes a first N$^{th}$ metal line, a first stop layer being disposed over a top electrode of a magnetic tunneling junction (MTJ) over the first N$^{th}$ metal line, a first (N+1)$^{th}$ metal via over the MTJ and surrounded by the first stop layer and a cap positioned between the first stop layer and the top electrode. The logic region includes a second N$^{th}$ metal line, a second stop layer disposed over an (N+1)$^{th}$ metal line and a second (N+1)$^{th}$ metal via over the (N+1)$^{th}$ metal line. N is an integer greater than or equal to 1 and the first stop layer is non-coplanar with the second stop layer.

Some embodiments of the present disclosure provide a method for manufacturing a semiconductor structure. The method includes (1) forming a magnetic tunneling junction (MTJ) over a first N$^{th}$ metal line in a memory region, (2) forming a top electrode over the MTJ, (3) forming a first stop layer over the top electrode in the memory region, (4) forming an (N+1)$^{th}$ metal line (123') over a second N$^{th}$ metal line (121B') in a logic region, (5) forming a second stop layer over the (N+1)$^{th}$ metal line in a logic region, and (6) forming a first (N+1)$^{th}$ metal via over the top electrode and a second (N+1)$^{th}$ metal via over the (N+1)$^{th}$ metal line concurrently. N is an integer greater than or equal to 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a memory region, the memory region comprises:
      a first metal line;
      a magnetic tunneling junction (MTJ) over the first metal line;
      a cap, wherein at least a portion of the cap is above the MTJ;
      a first stop layer above the cap; and
      a first metal via being disposed over the MTJ and in direct contact with the first stop layer; and
   a logic region adjacent to the memory region, the logic region comprises:
      a second metal line;
      a third metal line over the second metal line;
      a second stop layer being disposed over the third metal line; and
      a second metal via over the third metal line.

2. The semiconductor structure of claim 1, wherein a bottom surface of the second stop layer is above the top surface of the first etch stop layer.

3. The semiconductor structure of claim 1, wherein the first stop layer is in direct contact with the cap.

4. The semiconductor structure of claim 1, wherein the cap comprises a nitride-based material.

5. The semiconductor structure of claim 1, wherein a thickness of a portion of the cap is in a range from 5 nm to 30 nm.

6. The semiconductor structure of claim 1, wherein a bottom of the first metal via is below a bottom of the second metal via.

7. The semiconductor structure of claim 1, wherein a bottom surface of the second stop layer is above the cap.

8. The semiconductor structure of claim 1, wherein a total height of the first metal via is greater than a total height of the second metal via.

9. The semiconductor structure of claim 1, wherein a total width of the cap is greater than a total width of a bottom surface of the MTJ.

10. A semiconductor structure, comprising:
    a memory region, the memory region comprises:
       a first metal line;
       a magnetic tunneling junction (MTJ) over the first metal line;
       a spacer at least partially surrounding the MTJ in lateral direction;
       a protective layer, wherein at least a portion of the protective layer is above the MTJ; and a first metal via over the MTJ, wherein the protective layer is in direct contact with the spacer and the first metal via; and a logic region adjacent to the memory region, the logic region comprises:
   a second metal line;
   a third metal line over the second metal line; and
   a second metal via over the third metal line.

11. The semiconductor structure of claim 10, wherein at least a portion of the spacer is below a top surface of the protective layer.

12. The semiconductor structure of claim 10, wherein a total height of the first metal via is greater than a total height of the second metal via.

13. The semiconductor structure of claim 10, wherein a bottom surface of the first metal via is free from being aligned with a top surface of the spacer.

14. A semiconductor structure, comprising:
a memory region, the memory region comprises:
   a first metal line;
   a magnetic tunneling junction (MTJ) over the first metal line;
   a cap, wherein at least a portion of the cap is above the MTJ;
   a first stop layer over the cap; and
   a first metal via over the MTJ, wherein a bottom surface of the first metal via is below a top surface of the cap; and
a logic region adjacent to the memory region, the logic region comprises:
   a second metal line;
   a third metal line over the second metal line; and
   a second metal via over the third metal line.

15. The semiconductor structure of claim 14, wherein at least a portion of a sidewall of the first metal via is in direct contact with the cap.

16. The semiconductor structure of claim 14, wherein a top surface of the third metal line is above the bottom surface of the first metal via.

17. The semiconductor structure of claim 14, further comprising a top electrode above the MTJ.

18. The semiconductor structure of claim 17, wherein the top electrode is in direct contact with the cap.

19. The semiconductor structure of claim 17, wherein a portion of a top surface of the top electrode is in direct contact with the cap.

20. The semiconductor structure of claim 14, wherein the bottom surface of the first metal via is below a bottom of the second metal via.

* * * * *